United States Patent
Rochas

(10) Patent No.: US 8,941,436 B2
(45) Date of Patent: Jan. 27, 2015

(54) LOGIC CIRCUIT DEVICE COMPRISING AT LEAST ONE DIGITAL INPUT

(71) Applicant: THALES, Neuilly-sur-Seine (FR)

(72) Inventor: Vincent Rochas, Chabeuil (FR)

(73) Assignee: THALES, Neuilly-sur-Seine (FR)

( * ) Notice: Subject to any disclaimer, the term of this patent is extended or adjusted under 35 U.S.C. 154(b) by 55 days.

(21) Appl. No.: 13/782,178

(22) Filed: Mar. 1, 2013

(65) Prior Publication Data

US 2014/0077837 A1    Mar. 20, 2014

(30) Foreign Application Priority Data

Mar. 8, 2012 (FR) ..................................... 12 00701

(51) Int. Cl.
*H01H 37/76* (2006.01)
*H03K 19/003* (2006.01)
*H03K 19/173* (2006.01)

(52) U.S. Cl.
CPC ...... *H03K 19/00346* (2013.01); *H03K 19/1733* (2013.01)
USPC .............................. 327/525; 327/526; 326/38

(58) Field of Classification Search
CPC ............... G11C 17/16; G11C 11/5692; H03K 19/1733; H03K 17/223; H01L 23/60
USPC ........ 327/525, 526, 52, 66; 326/96, 104, 200, 326/230
See application file for complete search history.

(56) References Cited

U.S. PATENT DOCUMENTS

| | | | | |
|---|---|---|---|---|
| 4,789,966 A | * | 12/1988 | Ozaki | 365/96 |
| 6,201,432 B1 | * | 3/2001 | Lim et al. | 327/525 |
| 6,995,601 B2 | * | 2/2006 | Huang et al. | 327/525 |
| 2001/0052794 A1 | | 12/2001 | Hidaka | |
| 2008/0048737 A1 | * | 2/2008 | Ito et al. | 327/109 |
| 2008/0082876 A1 | | 4/2008 | Yu | |

OTHER PUBLICATIONS

Institut National De La Propriete Industrielle; Preliminary Search Report; Dec. 5, 2012; Paris, France.

* cited by examiner

*Primary Examiner* — Vibol Tan
(74) *Attorney, Agent, or Firm* — Michael J. Donohue; Davis Wright Tremaine LLP

(57) ABSTRACT

The invention pertains to a logic circuit device comprising at least one digital input furnished with a fuse (FUS) being, in the closed state, suitable for applying an electrical input voltage of the logic circuit corresponding to a first logic state from among the logic states 0 and 1, and, in the definitive open state, suitable for applying an electrical input voltage of the logic circuit corresponding to the second logic state from among the logic states 0 and 1, said fuse (FUS) being suitable for being placed definitively in the second logic state by injection of a current greater than a threshold current (CS).

10 Claims, 2 Drawing Sheets

LOGIC CIRCUIT DEVICE COMPRISING AT LEAST ONE DIGITAL INPUT

BACKGROUND OF THE INVENTION

1. Field of the Invention

The present invention pertains to a logic circuit device comprising at least one digital input.

2. Description of the Related Art

Logic circuits comprising at least one digital input, such as Application-Specific Integrated Circuits (ASICs), are known.

Systems making it possible to fix a logic level in an unalterable manner on a digital input are known.

For example, it is possible to fix the inputs of a logic circuit by hard-wiring, with two resistors, and by wiring up either one or the other the logic level is modified. In this case, the inputs are determined before assembling the electronic card, and the mounted components define the logic levels.

FIG. 1 illustrates such an embodiment, in which two resistors Ra and Rb, for example of the order of 100 kΩ, and Vcc represents the electrical power supply for the device.

Such an implementation is constraining, since the parameters to be programmed must be defined before the electronic card is hard-wired.

It is also known to electrically link two surfaces electrically insulated from one another with conducting wires but this technique is complex and expensive.

It is also known to bond two surfaces electrically insulated from one another, with the aid of a conducting glue or of a weld so as to ensure electrical connection.

Finally, it is known to cut out copper track for example by laser, or by means of a cutting object such as a knife or a scalpel, so as to eliminate an electrical connection between two surfaces electrically insulated from one another. This technique requires particular shapes of the substrate in order to carry out the cutting.

But all these solutions require physical intervention on the electronic card, this often being lengthy, expensive and constraining.

BRIEF SUMMARY OF THE INVENTION

An aim of the invention is to propose a device which is less expensive and easier to implement.

There is proposed, according to one aspect of the invention, a logic circuit device comprising at least one digital input furnished with a fuse being, in the closed state, suitable for applying an electrical input voltage of the logic circuit corresponding to a first logic state from among the logic states 0 and 1, and, in the definitive open state, suitable for applying an electrical input voltage of the logic circuit corresponding to the second logic state, opposite to the first logic state, from among the logic states 0 and 1, said fuse being suitable for being placed definitively in the second logic state by injection of a current greater than a threshold current. Said digital input comprises, furthermore, a first resistor for maintaining input electrical potential corresponding to the second logic state, and an assembly comprising a second resistor for limiting current in the fuse and a third electrical test input point which are connected electrically, said assembly being connected electrically between the fuse and the first resistor.

Such a device makes it possible to produce a device in a generic manner, therefore of reduced cost, for which it is easy, thereafter, to unalterably fix the logic level of the digital input of the logic circuit. When the digital input is furnished with a fuse suitable for applying, in the closed state, an electrical input voltage of the logic circuit corresponding to a first 0 logic state, then in the definitive open state it is suitable for applying an electrical input voltage of the logic circuit corresponding to the second 1 logic state, and vice versa, when the digital input is furnished with a fuse suitable for applying, in the closed state an electrical input voltage of the logic circuit corresponding to a first 1 logic state, then in the definitive open state it is suitable for applying an electrical input voltage of the logic circuit corresponding to the second 0 logic state.

Furthermore, the bulk is then reduced.

The presence of this first resistor allows the maintaining of the electrical input potential corresponding to the second logic state corresponding to the open fuse, when the fuse is open the resistor fixes the logic level inverse to that fixed by the fuse in its closed state.

The use of this assembly makes it possible to limit the current in the fuse, so that it does not open when an electrical current and/or an electrical voltage corresponding to the second logic state is applied, during a test, to the corresponding input.

Hence, when it is desired to open the fuse in a correct manner, it is necessary to apply the nominal voltage indicated by the constructor of the fuse.

But this voltage (generally of the order of 30V) is greater than the voltage admissible by the input of the digital circuit (generally at the maximum 1.6V for 1.2V logic and 6V for 5V logic) for fear of destruction.

By virtue of the addition of the second resistor R2 and of the third electrical test input point Ptest, it is possible during the opening of the fuse to protect the input of the digital circuit. Accordingly, it is necessary to link the third electrical test input point Ptest to earth, while the nominal voltage and the nominal current of the fuse are applied to the second electrical input point Pmef to open the fuse.

For example, said fuse is electrically linked at a first end to earth and at a second end to the digital input, and the first resistor is disposed between the digital input and a first electrical input point for powering the logic circuit.

Thus, in the definitive open state, the first resistor makes it possible to provide an input in the 1 logic state. Furthermore, in the closed state, the fuse makes it possible to provide an input in the 0 logic state.

As a variant, the first resistor is electrically linked at a first end to earth and at a second end to the digital input, and the fuse is disposed between the digital input and a first electrical input point for powering the logic circuit.

Thus, in the definitive open state, the first resistor makes it possible to provide an input in the 0 logic state. Furthermore, in the closed state, the fuse makes it possible to provide an input in the 1 logic state.

In one embodiment, said digital input comprises, furthermore, a second electrical input point for placing the fuse in the definitive open state, directly connected electrically to an electrical bond between the first resistor and the fuse.

It is thus easy, after production of an electronic card, for the fuses corresponding to digital inputs of the logic circuit that must be in the second logic state, to be placed in the definitive open state.

The value of the threshold current can depend on operating characteristics of the fuse.

In one embodiment, the value of the first resistor is greater than a first threshold resistance dependent on operating characteristics of the logic circuit and of the fuse.

According to one embodiment, the value of the second resistor is greater than a second threshold resistance dependent on characteristics of the fuse.

In one embodiment, the fuse is suitable for passing definitively in the open state an electrical current of less than or equal to 500 mA.

Furthermore, the fuse can have an occupancy area of less than or equal to 5 mm².

BRIEF DESCRIPTION OF THE SEVERAL VIEWS OF THE DRAWINGS

The invention will be better understood on studying a few embodiments described by way of wholly non-limiting examples and illustrated by the appended drawings in which.

In all the figures, elements having identical references are similar.

DETAILED DESCRIPTION OF THE INVENTION

Figure 1:
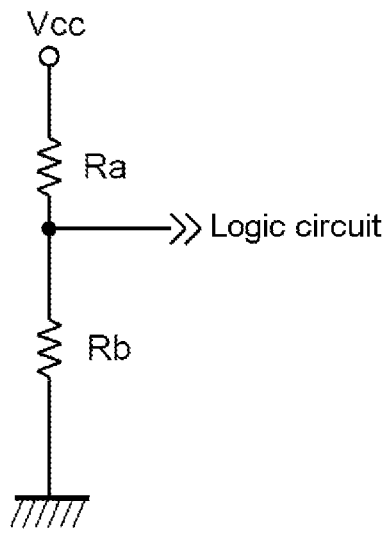
FIG. 1 schematically illustrates a logic circuit device comprising at least one digital input, according to the prior art.
Figure 2A:
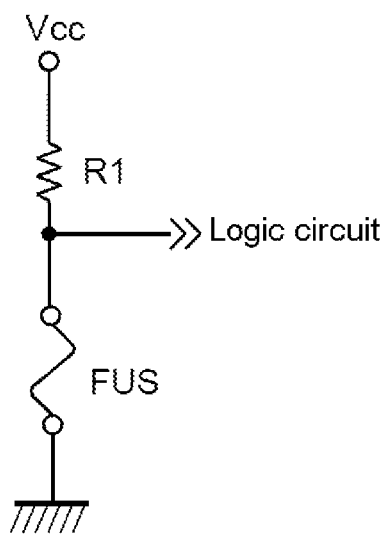
FIGS. 2a and 2b schematically illustrate two logic circuit devices comprising at least one digital input, furnished with a hard-wired fuse, according to one aspect of the invention.

As illustrated in FIG. 2a, the logic circuit device comprises at least one digital input, in this instance one, furnished with a fuse FUS, connected electrically at a first end to earth. The fuse FUS is, in the closed state, suitable for allowing an electrical input voltage of the logic circuit corresponding to a 0 logic state, and, in the definitive open state, suitable for allowing an electrical input voltage of the logic circuit corresponding to a 1 logic state. The fuse FUS is suitable for being placed definitively in the open state by injection of a current greater than a threshold current CS, making it toggle to the definitive open state.

The digital input comprises, furthermore, a first resistor R1 for maintaining the electrical input potential at an electrical potential corresponding to the 1 logic state, disposed between a second end of the fuse FUS and a first electrical input point Vcc for powering the logic circuit.

Figure 2B:
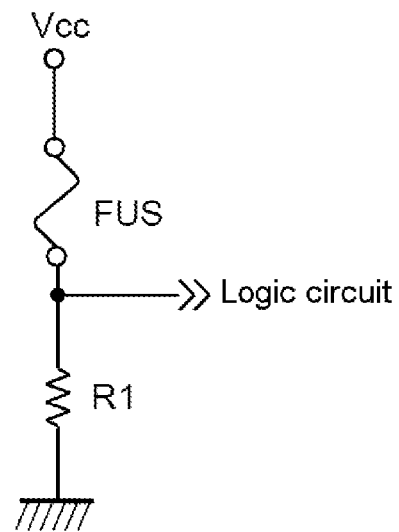

As illustrated in FIG. 2b, as a variant of the device of FIG. 2a, the logic circuit device comprises at least one digital input, in this instance one, furnished with a fuse FUS, connected electrically at a first end to a first electrical input point Vcc for powering the logic circuit. The fuse FUS is, in the closed state, suitable for allowing an electrical input voltage of the logic circuit corresponding to a 1 logic state, and, in the definitive open state, suitable for allowing an electrical input voltage of the logic circuit corresponding to a 0 logic state. The fuse FUS is suitable for being placed definitively in an open state by injection of a current greater than a threshold current CS, making it toggle to the definitive open state.

The digital input comprises, furthermore, a first resistor R1 for maintaining the electrical input potential at an electrical potential corresponding to the 0 logic state, disposed between a second end of the fuse FUS and earth.

For example, the threshold current CS can be less than 500 mA.

Figure 3A:
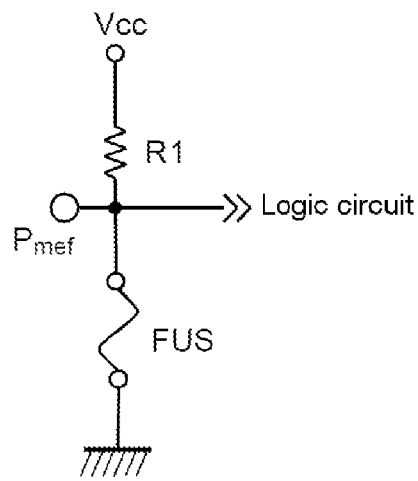
FIGS. 3a and 3b schematically illustrate two devices respectively according to FIGS. 2a and 2b, furnished with an electrical input point for placing the fuse in the definitive open state, according to one aspect of the invention.

FIG. 3a is a device similar to that of FIG. 2a, furnished, furthermore, with a second electrical input point Pmef for placing the fuse in the definitive open state. The second electrical input point Pmef is directly connected electrically to the second end, not linked to earth, of the fuse FUS, and directly connected electrically to the other end of the first resistor R1, not connected electrically to the electrical voltage input point Vcc for powering the logic circuit.

It is thus easy after production of a generic electronic card, by way of a toolkit injecting a sufficient current, i.e. greater than a threshold that may depend on the characteristics of the fuse FUS, for the fuses FUS whose corresponding digital input must have a definitive logic state set to 1, to be placed in the definitive open state.

Figure 3B:
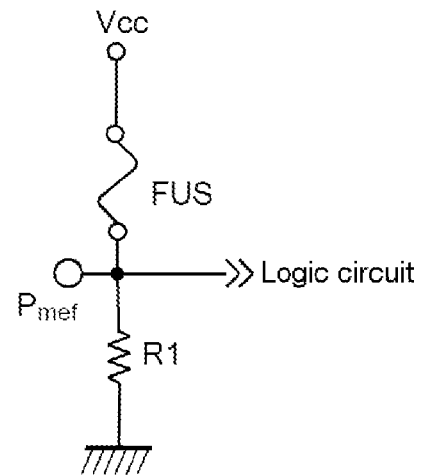

FIG. 3b is a device similar to that of FIG. 2b, furnished, furthermore, with a second electrical input point Pmef for placing the fuse in the definitive open state. The second electrical input point Pmef is directly connected electrically to the second end of the fuse FUS, which end is not linked electrically to the first electrical input point Vcc for powering the logic circuit, and directly connected electrically to the other end of the first resistor R1, not connected electrically to earth.

It is thus easy after production of a generic electronic card, by way of a toolkit injecting a sufficient current, i.e. greater than a threshold that may depend on the characteristics of the fuse FUS, for the fuses FUS whose corresponding digital input must have a definitive logic state set to 0, to be placed in the definitive open state.

Figure 4A:
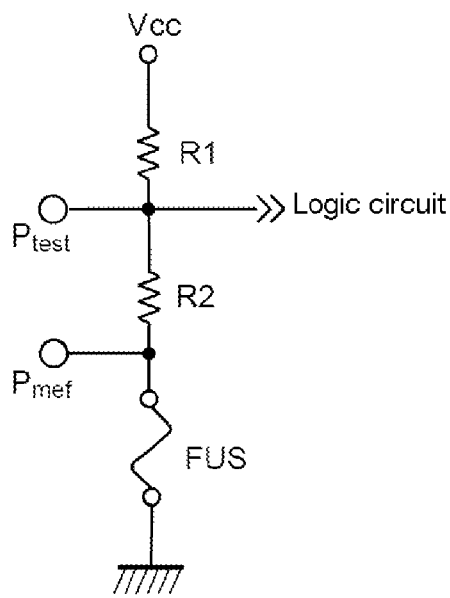
FIGS. 4a and 4b schematically illustrate two devices respectively according to FIGS. 3a and 3b, furnished with a second resistor for limiting current in the fuse and with an electrical test input point, according to one aspect of the invention.

In FIG. 4a is presented a device similar to that of FIG. 3a, but furnished, furthermore, with an assembly comprising a second resistor R2 for limiting current in the fuse FUS and a third electrical test input point Ptest which are connected electrically, said assembly being connected electrically between the fuse FUS and the first resistor R1.

The second resistor R2 is disposed between the end not linked to earth of the fuse FUS and the end of the first resistor R1 not linked to the first electrical input point Vcc for powering the logic circuit. The third electrical test input point Ptest is directly connected electrically to an electrical bond between the first resistor R1 and the second resistor R2.

The first resistor R1 can generally have a value of between 1 kΩ and 10000 kΩ, for example of the order of 100 kΩ, and the second resistor R2 a value of the order of a tenth of that of R1, for example of the order of 10 kΩ.

Figure 4B:
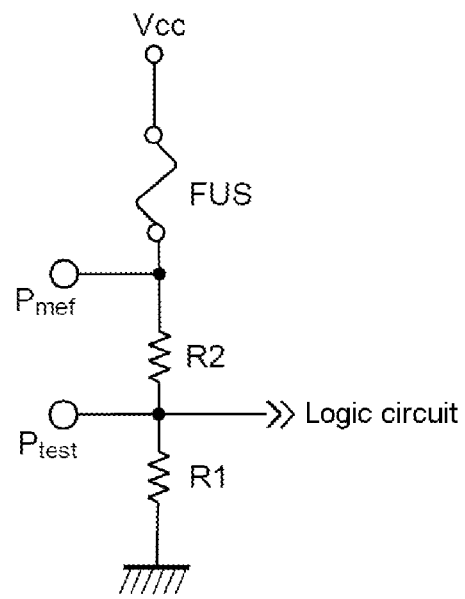

In FIG. 4b is presented a device similar to that of FIG. 3b, but furnished, furthermore, with an assembly comprising a second resistor R2 for limiting current in the fuse FUS and a third electrical test input point Ptest which are connected electrically, said assembly being connected electrically between the fuse FUS and the first resistor R1.

The second resistor R2 is disposed between the end of the first resistor R1 not linked to earth and the end of the fuse FUS that is not linked to the first electrical input point Vcc for powering the logic circuit. The third electrical test input point Ptest is directly connected electrically to an electrical bond between the first resistor R1 and the second resistor R2.

The first resistor R1 can generally have a value of between 1 kΩ and 10000 kΩ, for example of the order of 100 kΩ, and the second resistor R2 a value of the order of a tenth of that of R1, for example of the order of 10 kΩ.

The value of the resistor R1 depends on the voltage and current characteristics of the digital input. The choice of the fuse FUS also depends on the characteristics of the digital input. The value of the resistor R2 depends on the threshold current for opening the fuse FUS.

In all the previous examples, it is preferably possible to use fuses FUS suitable for passing definitively in the open state an electrical current of less than or equal to 500 mA, and having an occupancy area of less than or equal to 5 mm².

The invention claimed is:

1. A logic circuit device comprising at least one digital input furnished with a fuse (FUS) being, in the closed state, suitable for applying an electrical input voltage of the logic circuit corresponding to a first logic state from among the logic states 0 and 1, and, in the definitive open state, suitable for applying an electrical input voltage of the logic circuit corresponding to the second logic state, opposite to the first logic state, from among the logic states 0 and 1, said fuse (FUS) being suitable for being placed definitively in the second logic state by injection of a current greater than a threshold current (CS), in which said digital input comprises, furthermore, a first resistor (R1) for maintaining input electrical potential corresponding to the second logic state, and an assembly comprising a second resistor (R2) for limiting current in the fuse (FUS) and a third electrical test input point (Ptest) which are connected electrically, said assembly being connected electrically between the fuse (FUS) and the first resistor (R1) in which said digital input comprises, furthermore, a second electrical input point (Pmef) for placing the fuse (FUS) in the definitive open state, directly connected electrically to an electrical bond between the first resistor (R1) and the fuse (FUS).

2. The device as claimed in claim 1, in which the fuse (FUS) is electrically linked at a first end to earth and at a second end to the digital input, and the first resistor (R1) is disposed between the digital input and a first electrical input point (Vcc) for powering the logic circuit.

3. The device as claimed in claim 1, in which the first resistor (R1) is electrically linked at a first end to earth and at a second end to the digital input, and the fuse (FUS) is disposed between the digital input and a first electrical input point (Vcc) for powering the logic circuit.

4. The device as claimed in claim 1, in which the value of the threshold current (CS) depends on operating characteristics of the fuse.

5. The device as claimed in claim 1, wherein the threshold current (CS) is less than or equal to 500 mA.

6. The device as claimed in claim 1, in which the fuse (FUS) has an occupancy area of less than or equal to 5 mm$^2$.

7. The device as claimed claim 2, in which the value of the threshold current (CS) depends on operating characteristics of the fuse.

8. The device as claimed claim 3, in which the value of the threshold current (CS) depends on operating characteristics of the fuse.

9. The device as claimed claim 5, in which the value of the threshold current (CS) depends on operating characteristics of the fuse.

10. The device as claimed claim 6, in which the value of the threshold current (CS) depends on operating characteristics of the fuse.

* * * * *